(12) United States Patent
Reddy et al.

(10) Patent No.: US 6,636,979 B1
(45) Date of Patent: Oct. 21, 2003

(54) SYSTEM FOR MEASURING PHASE ERROR BETWEEN TWO CLOCKS BY USING A PLURALITY OF PHASE LATCHES WITH DIFFERENT RESPECTIVE DELAYS

(75) Inventors: Dayanand K. Reddy, Minneapolis, MN (US); Joel J. Christiansen, Independence, MN (US); Ian MacPherson Flanagan, Minneapolis, MN (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/548,507

(22) Filed: Apr. 13, 2000

(51) Int. Cl.[7] .................................................. G06F 11/00
(52) U.S. Cl. ..................... 713/503; 714/798; 714/799; 375/215; 342/103
(58) Field of Search ........................ 713/503; 714/798, 714/799; 375/215; 342/103

(56) References Cited

U.S. PATENT DOCUMENTS

| 4,151,463 | A | * | 4/1979 | Kibler ..................... 324/76.53 |
| 5,909,130 | A | * | 6/1999 | Martin et al. ................. 327/12 |
| 6,094,078 | A | * | 7/2000 | Suzuki ........................ 327/156 |
| 6,177,842 | B1 | * | 1/2001 | Ahn et al. ................... 331/1 A |
| 6,194,916 | B1 | * | 2/2001 | Nishimura et al. ........... 327/12 |
| 6,252,465 | B1 | * | 6/2001 | Katoh .......................... 331/25 |
| 6,496,554 | B1 | * | 12/2002 | Ahn ........................... 375/376 |

* cited by examiner

Primary Examiner—Thomas Lee
Assistant Examiner—Michael Nieves
(74) Attorney, Agent, or Firm—Westman, Champlin & Kelly, P.C.

(57) ABSTRACT

A phase error measurement circuit for measuring phase error between two clocks on an integrated circuit is provided. The measurement circuit includes first and second clock signal inputs, a phase lead detector, a phase lag detector and a phase error measurement output. The phase lead detector includes a phase lead latch having a data input, which is coupled to the first clock signal input, a latch control input, which is coupled to the second clock signal input and a data output. The phase lag detector includes a phase lag latch having a data input, which is coupled to the second clock signal input, a latch control input, which is coupled to the first clock signal input and a data output. The phase error measurement output is formed by the data outputs of the phase lead latch and the phase lag latch.

19 Claims, 3 Drawing Sheets

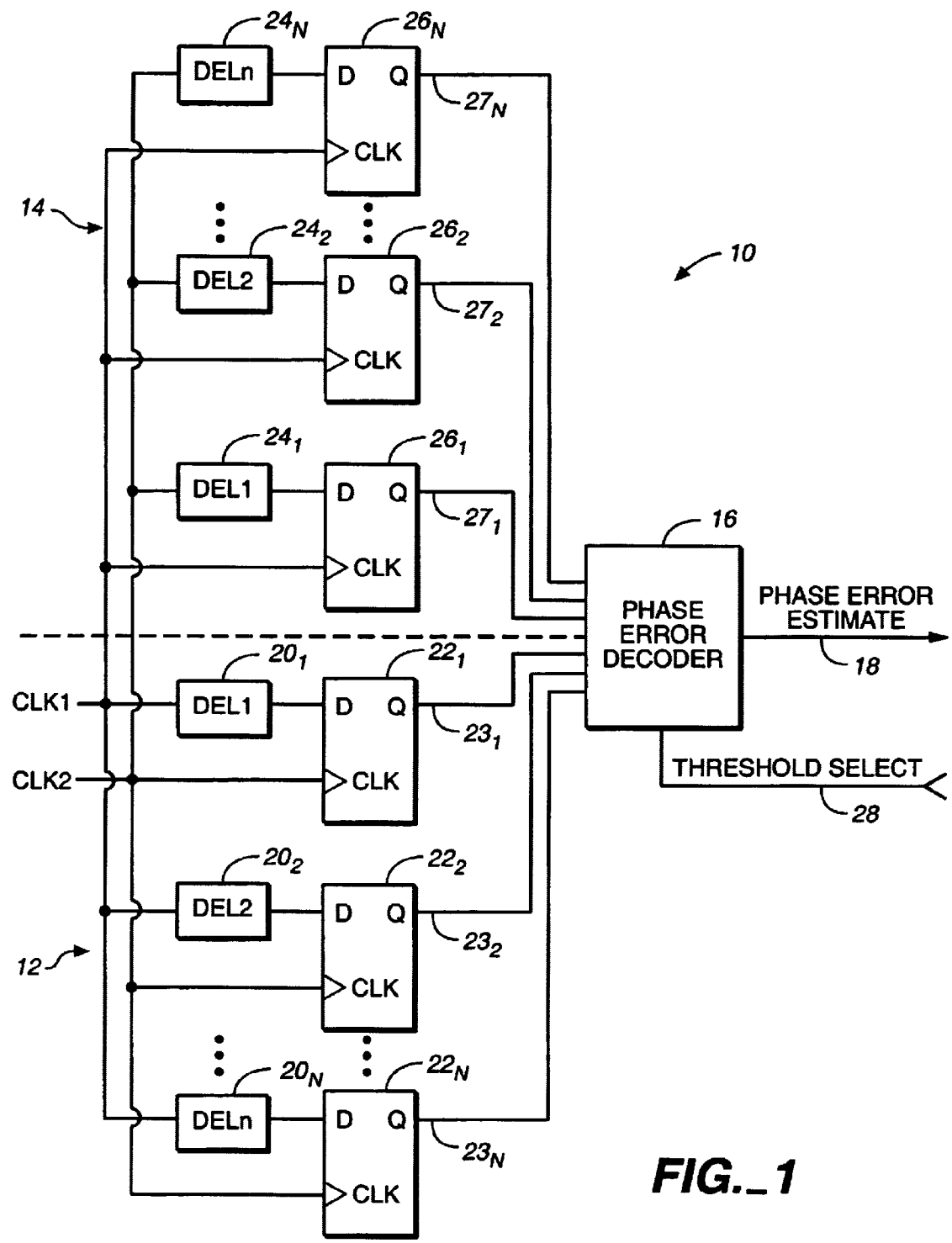
FIG._1

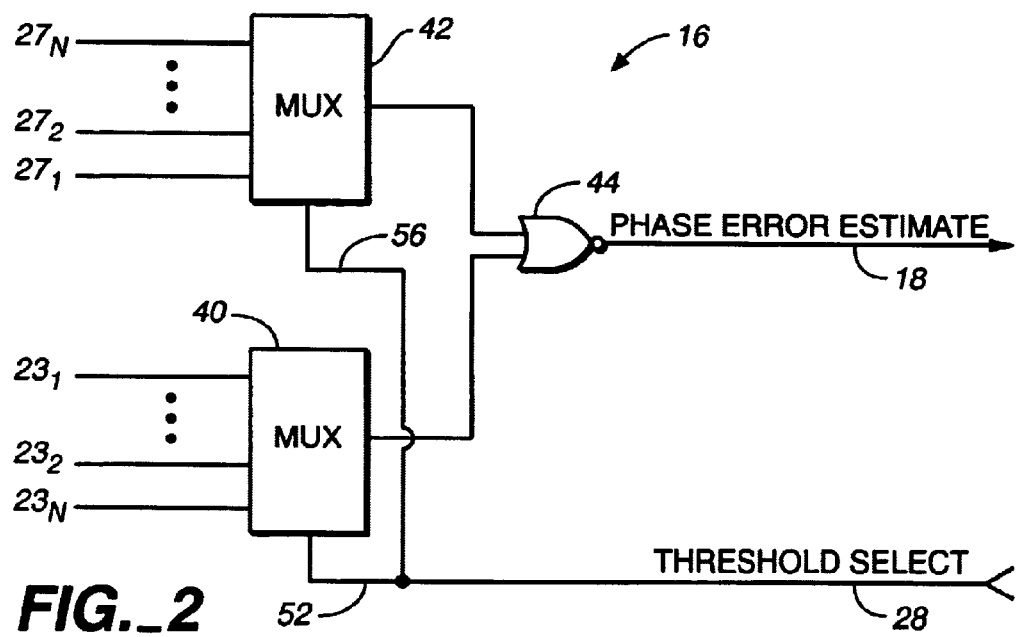
FIG._2
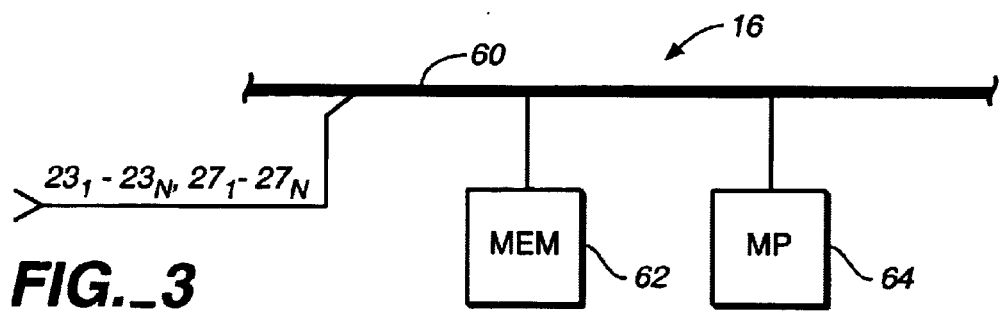
FIG._3
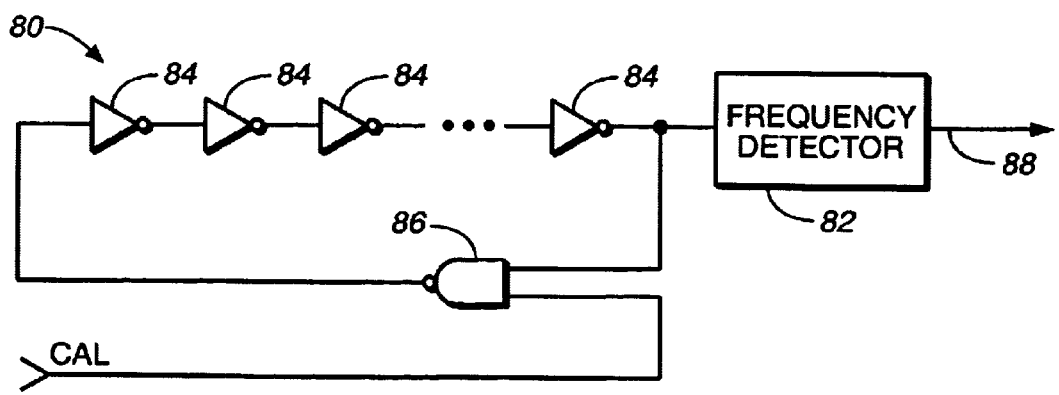
FIG._4

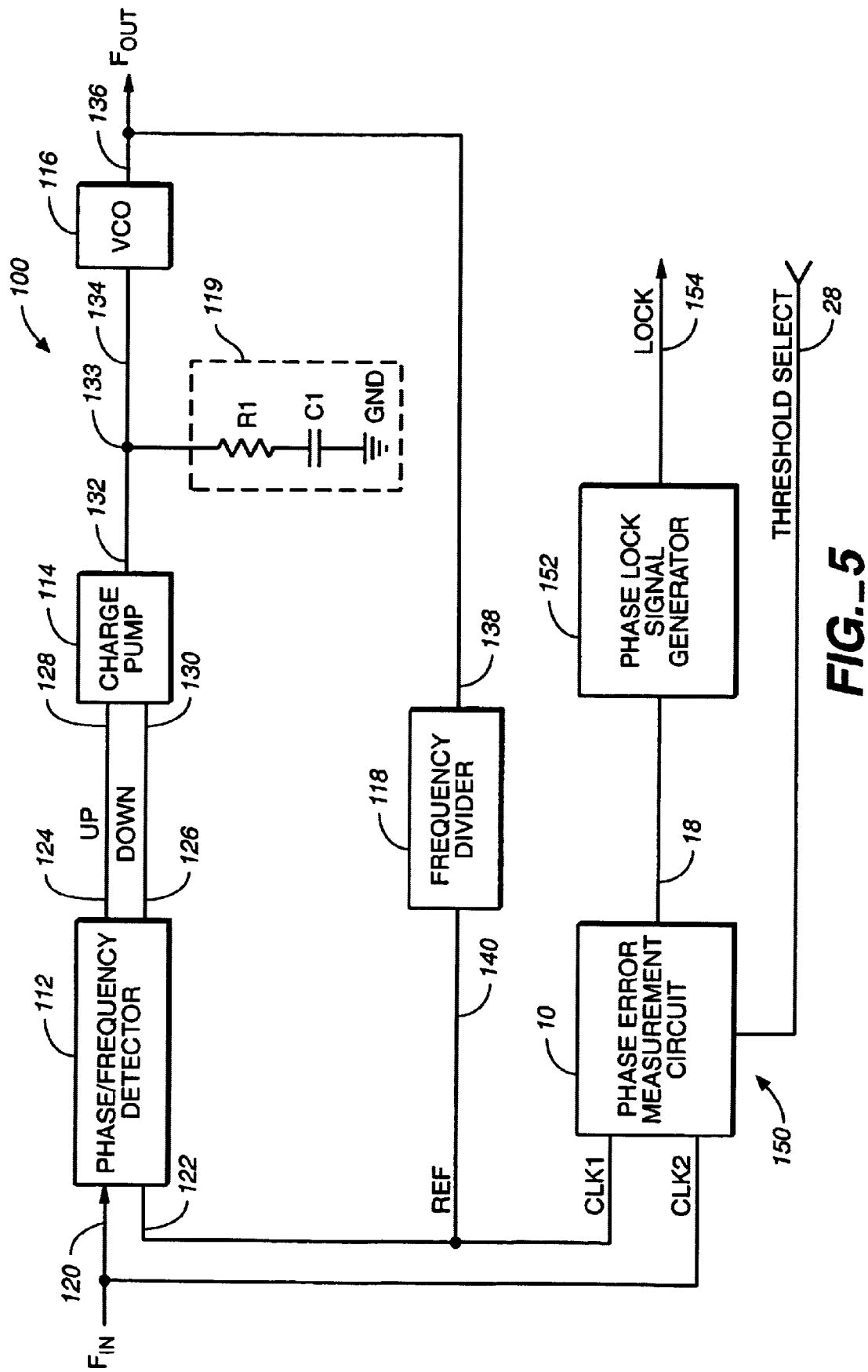
FIG._5

SYSTEM FOR MEASURING PHASE ERROR BETWEEN TWO CLOCKS BY USING A PLURALITY OF PHASE LATCHES WITH DIFFERENT RESPECTIVE DELAYS

BACKGROUND OF THE INVENTION

The present invention relates to semiconductor integrated circuits and, more particularly, to a circuit for measuring phase error between two clock signals on the integrated circuit.

Clock signals are used in semiconductor integrated circuits for clocking sequential elements of the circuit. A typical integrated circuit uses multiple individual clock signals having the same or different frequencies for operating various portions of the integrated circuit. In order to minimize timing errors between sequential elements, it is desirable to minimize the phase error between individual clock signals. The phase error between two clocks on an integrated circuit can vary from one integrated circuit to the next due to variances in process, voltage and temperature, known as "PVT". The variations in process can be caused by fabrication tolerances of the individual semiconductor devices and their interconnects on the integrated circuit. Phase errors exceeding a specified timing margin can induce errors in functionality and other performance problems on the integrated circuit.

For example, phase error between two clocks is an important factor in the operation of phase-locked loops (PLLs). PLLs are used in integrated circuits, such as application specific integrated circuits (ASICs) for clock synchronization and for recovery of serial data streams. Once a PLL has locked a reference feedback signal onto the phase and frequency of an input signal, any remaining phase error between the reference feedback signal and the input signal is known as "jitter". Depending on PLL performance and implementation, the PLL jitter can become unacceptably large for a particular integrated circuit. This can lead to difficulties in clock synchronization or accurate recovery of serial data streams.

SUMMARY OF THE INVENTION

One aspect of the present invention is directed to a phase error measurement circuit for estimating phase error between two clock signals on an integrated circuit. The measurement circuit includes first and second clock signal inputs, a phase lead detector, a phase lag detector and a phase error measurement output. The phase lead detector includes a phase lead latch having a data input, which is coupled to the first clock signal input, a latch control input, which is coupled to the second clock signal input and a data output. The phase lag detector includes a phase lag latch having a data input, which is coupled to the second clock signal input, a latch control input, which is coupled to the first clock signal input and a data output. The phase error measurement output is formed by the data outputs of the phase lead latch and the phase lag latch.

Another aspect of the present invention is directed to a phase error measurement circuit, which includes a first clock signal input and a second clock signal input. A delay circuit delays the first clock signal input by a phase lead measuring delay to produce a delayed first clock signal input. A further delay circuit delays the second clock signal input by a phase lag measuring delay to produce a delayed second clock signal input. A phase lead measuring circuit detects whether the delayed first clock signal input leads the second clock signal input, and a phase lag measuring circuit detects whether the delayed second clock signal input leads the first clock signal input.

Another aspect of the present invention is directed to a method of measuring phase error between first and second clock signals on an integrated circuit. The method includes: delaying the first clock signal by a phase lead delay to produce a delayed first clock signal; latching the delayed first clock signal with an edge-triggered phase lead latch as a function of the second clock signal to produce a phase lead indicating output signal; delaying the second clock signal by a phase lag delay to produce a delayed second clock signal; latching the delayed second clock signal with an edge-triggered phase lag latch as a function of the first clock signal to produce a phase lag indicating output signal; and generating signal indicative of the phase error between the first and second clock signals relative to the phase lead delay and the phase lag delay based on the phase lead indicating output and the phase lag indicating output.

Yet another aspect of the present invention is directed to a phase-locked loop, which includes a phase detector, a charge pump, a loop filter, a voltage-controlled oscillator and a phase lock detector. The phase detector has a clock input, a feedback input, and a charge control output. The charge pump is coupled to the charge control output, and the loop filter is coupled to the charge pump. The voltage controlled oscillator has a control voltage input coupled to the loop filter and a clock output coupled to the feedback input. The phase lock detector includes a phase lead detector, a phase lag detector and a phase lock signal generator. The phase lead detector includes a phase lead latch having a data input coupled to the feedback input, a latch control input coupled to the clock input, a data output and a phase lead delay from the feedback input to the data output. The phase lead delay represents a threshold phase difference between the feedback input and the clock input under which the phase-locked loop is in a lock state. The phase lag detector includes a phase lag latch having a data input coupled to the clock input, a latch control input coupled to the feedback input, a data output and a phase lag delay from the clock input to the data output, which represents the threshold phase difference. The phase lock signal generator receives the data outputs of the phase lead and phase lag latches and responsively generates a phase lock signal indicative of whether the phase-locked loop is in the lock state.

BRIEF DESCRIPTION OF THE DRAWINGS

FIG. 1 is a block diagram of a phase error measurement circuit according to one embodiment of the present invention.

FIG. 2 is a schematic diagram of a phase error decoder within the measurement circuit shown in FIG. 1, according to one embodiment of the present invention.

FIG. 3 is a block diagram of a phase error decoder according to an alternative embodiment of the present invention.

FIG. 4 is a schematic diagram of a calibration circuit that can be used to calibrate phase lead and phase lag-delays used in the circuit shown in FIG. 1.

FIG. 5 is a block diagram of a phase-locked loop (PLL) having a phase lock detector according to one embodiment of the present invention.

DETAILED DESCRIPTION OF THE PREFERRED EMBODIMENTS

The phase error measurement circuit of the present invention estimates phase error between two clock signals on an integrated circuit. The phase error measurement circuit can be used in a variety of applications to detect when the phase error between two clocks exceeds a specified threshold or to provide an estimate of the direction and magnitude of the phase error. The circuit can be easily extended to achieve any desired granularity.

FIG. 1 is a block diagram of a phase error measurement circuit 10 according to one embodiment of the present invention. Phase error measurement circuit 10 includes clock signal inputs CLK1 and CLK2, phase lead detector 12, phase lag detector 14, phase error decoder 16 and phase error estimate output 18.

Phase lead detector 12 includes one or more phase lead delay elements $20_1$–$20_N$ (labeled DEL1–DELn) and one or more phase lead latches $22_1$–$22_N$, where N is a positive integer variable. Similarly, phase lag detector 14 includes one or more phase lag delay elements $24_1$–$24_N$ (labeled DEL1–DELn) and one or more phase lag latches $26_1$–$26_N$. In one embodiment, latches $22_1$–$22_N$ and $26_1$–$26_N$ each include a positive edge triggered D-type flip-flop having a latch data input "D", a latch data output "Q" and a latch control or clock input "CLK". However, other types of positive or negative edge-triggered latches can also be used in alternative embodiments.

Referring to phase lead detector 12, the latch data inputs "D" of phase lead latches $22_1$–$22_N$ are coupled to clock signal input CLK1 through respective ones of the phase lead delay elements $20_1$–$20_N$. The latch control inputs "CLK" of phase lead latches $22_1$–$22_N$ are coupled to clock signal input CLK2. The latch data outputs "Q" of phase lead latches $22_1$–$22_N$ together form a multiple-bit phase lead error output $23_1$–$23_N$, which is coupled to phase error decoder 16.

Referring to phase lag detector 12, the latch data inputs "D" of phase lag latches $26_1$–$26_N$ are coupled to clock signal input CLK2 through respective ones of the phase lag delay elements $24_1$–$24_N$. The latch control inputs "CLK" of phase lag latches $26_1$–$26_N$ are coupled to clock signal input CLK1. The latch data outputs "Q" of phase lag latches $26_1$–$26_N$ together form a multiple-bit phase lag error output $27_1$–$27_N$, which is coupled to phase error decoder 16.

Phase lead delay elements $20_1$–$20_N$ represent the total delay from clock signal input CLK1 to the latch data output "Q" of the respective phase lead latches $22_1$–$22_N$, including any internal delay within that latch. The internal delay can include the setup time of the latch data input "D" relative to the latch control input "CLK". Phase lead delay elements $20_1$–$20_N$ can also include additional external delay elements, such as an even number of series-connected inverters, coupled between the latch data input "D" and clock signal input CLK1. Similarly, each phase lag delay element $24_1$–$24_N$ represents the total delay from clock signal input CLK2 to the corresponding latch data output "Q" of phase lag latches $26_1$–$26_N$.

In order to provide a graduated measure of the phase error, each phase lead delay element $20_1$–$20_N$ has a different time delay than the other phase lead delay elements $20_1$–$20_N$, and each phase lag delay element $24_1$–$24_N$ has a different time delay than the other phase lag delay elements $24_1$–$24_N$. In one embodiment, phase lead delay element 20, and phase lag delay element $24_1$ include only the internal delay of latches $22_1$ and $26_1$, and delay elements $20_2$–$20_N$ and $24_2$–$24_N$ have additional external delays. Multiple copies of the same base delay are used in delay elements $20_2$–$20_N$ and $24_2$–$24_N$ to provide progressively greater delays for phase lead latches $22_2$–$22_N$ and phase lag latches $26_2$–$26_N$, respectively.

During operation, if the rising edge of CLK1 leads the rising edge of CLK2 by at least the delay of phase lead delay element $20_1$, then phase lead latch $22_1$ stores a logic "1" on its "Q" output. If not phase lead latch $22_1$ stores a logic "0". If the rising edge of CLK1 leads the rising edge of CLK2 by at least the delay of phase lead delay element $20_2$, which is greater than the delay of phase lead delay element $20_1$, then phase lead latch $22_2$ stores a logic "1" on its "Q" output. This operation is repeated for each of the phase lead latches $22_1$–$22_N$. Thus, if CLK1 leads CLK2, then the logic patterned formed by phase lead error outputs $23_1$–$23_N$ represents the magnitude of the phase difference between CLK1 and CLK2 in terms of the delay of delay elements $20_1$–$20_N$. The granularity of the phase error measurement can be adjusted by adjusting the number of phase lead latches and the difference in delay between each of the phase lead delay elements.

Similarly, if clock signal input CLK1 lags clock signal input CLK2 by at least the delay of phase lag delay element $24_1$, then phase lag latch $26_1$ stores a logic "1" on its "Q" output. If not, phase lag latch $26_1$ stores a logic "0". This operation repeats for each of the phase lag latches $26_1$–$26_N$. Thus, if CLK1 lags CLK2, then the logic patterned formed by phase lag error outputs $27_1$–$27_N$ represents the magnitude of the phase difference between CLK1 and CLK2 in terms of the delay of delay elements $24_1$–$24_N$. In one embodiment, phase lag delay elements $24_1$–$24_N$ have the same delays as corresponding ones of phase lead delay elements $20_1$–$20_N$. The combined logic pattern formed by phase lead error outputs $23_1$–$23_N$ and phase lag error outputs $27_1$–$27_N$ therefore reflects a direction and magnitude of a phase difference between CLK1 and CLK2.

Phase error decoder 16 decodes the logic patterns formed by phase lead error outputs $23_1$–$23_N$ and phase lag error outputs $27_1$–$27_N$ to produce an estimate of the direction and magnitude of the phase difference between CLK1 and CLK2. Phase error decoder 16 can include any suitable decoder circuit, such as combinational logic, a state machine or a microprocessor and can be implemented in hardware, software or a combination of both. Phase error estimate output 18 can be a multiple-bit digital estimate value, a single-bit status flag or an analog level, depending on the particular configuration adopted.

In one embodiment, phase error decoder 16 decodes all of the phase error outputs $23_1$–$23_N$ and $27_1$–$27_N$ and, based on the logic patterned produced on these outputs, generates a phase error output signal representing the magnitude and direction of the phase error. In another embodiment, phase error decoder 16 detects whether the phase error exceeds a predetermined threshold level. This threshold level can be pre-set within phase error decoder 16, or can be selected through a threshold select input 28. In either case, phase error decoder 16 monitors a selected pair of latches $22_1$–$22_N$ and $26_1$–$26_N$ and activates phase error estimate output 18 as a status flag, if the either of the respective phase error outputs $23_1$–$23_N$ and $27_1$–$27_N$ is high. This indicates that the phase error exceeds the delay of the selected delay element.

FIG. 2 is a schematic diagram of phase error decoder 16 according to one embodiment of the present invention. Phase error decoder 16 includes multiplexers 40 and 42 and logic-OR gate 44. The data inputs of multiplexer 40 are coupled to phase lead error outputs $23_1$–$23_N$, and the data output of multiplexer 40 is coupled to one of the inputs of OR gate 44. The data inputs of multiplexer 42 are coupled to phase lag error outputs $27_1$–$27_N$, and the data output of multiplexer 42 is coupled to the other input of OR gate 44. Multiplexers 40 and 42 have select inputs 52 and 56, respectively, which are coupled to threshold select input 28. The output of OR gate 44 forms phase error estimate output 18.

The value applied to threshold select input 28 determines which of phase error outputs 23₁–23_N and 27₁–27_N are applied to OR gate 44. If the phase error between CLK1 and CLK2 is greater than the delay of the corresponding pair of delay elements 20₁–20_N and 24₁–24_N (shown in FIG. 1), then one of the inputs to OR gate 44 will be a "1" causing phase error estimate output 18 to have a logic "1" state. If not, phase error estimate output 18 has a logic "0" state. Thus, phase error estimate output 18 indicates whether the phase error is greater than or less than the selected threshold level.

FIG. 3 is a block diagram of phase error decoder 16 according to an alternative embodiment of the present invention. In this embodiment, the phase lead and phase lag error outputs 23₁–23_N and 27₁–27_N are coupled to a system bus 60. Phase error decoder 16 further includes a memory 62 and a microprocessor 64, which are also coupled to system bus 60. Microprocessor 64 periodically stores the logic patterns formed by phase lead and phase lag error outputs 23₁–23_N and 27₁–27_N in memory 62. These patterns can then be retrieved by microprocessor 64 for analysis in generating the phase error estimate output 18. Also, if multiple logic patterns are stored over time in memory 62, memory 62 will contain a history of the phase error between clock signal inputs CLK1 and CLK2. This phase error history can be used to detect conditions such as degradation of clock jitter between two clock signals on an integrated circuit, for example. Other tests and statistical analyses can also be performed.

FIG. 4 is a schematic diagram of a calibration circuit that can be used to calibrate the phase lead and phase lag delays used in FIG. 1. The calibration circuit includes a ring oscillator 80 and a frequency detector 82. Ring oscillator 80 includes a large number of delay elements, such as inverters 84, which are coupled together in a ring with NAND gate 86 such that the total number of inversions in the ring is odd. Multiple copies of the same delay are used in ring oscillator 80 as were used as base delay elements in FIG. 1. Ring oscillator 80 is fabricated on the same integrated circuit as phase measurement circuit 10 such that it is subject to the same variations in process, voltage and temperature.

When calibration is performed, the user or the software operating the integrated circuit asserts calibration input CAL to begin oscillation. Frequency detector 82 measures the frequency of the output waveform of ring oscillator 80 and generates a measurement output 88 representative of the actual delay of each of the base delay elements. For example, the calibration can be carried out using an oscilloscope in the lab through appropriate test points on the integrated circuit. Alternatively, the calibration can be done within the integrated circuit using a counter, which is clocked by a known frequency. Other frequency detection/delay measurement circuits can also be used. Output 88 can then be provided to phase error decoder 16 (shown in FIG. 1) or other supporting circuitry for calibrating phase error estimate output 18.

The phase error measurement circuit of the present invent-ion can be used in a variety of applications on an integrated circuit to measure the phase error between two clocks. For example, the circuit can be used to verify frequency and phase lock in a phase-locked loop (PLL). Additionally, the circuit can be used as part of a built-in self test (BIST) function to estimate phase error in a PLL and compare the estimated phase error with a threshold value.

FIG. 5 is a block diagram of a phase-locked loop (PLL) having a phase lock detector according to one embodiment of the present invention. PLL 100 is implemented on an integrated circuit and includes phase/frequency detector 112, charge pump 114, voltage-controlled oscillator (VCO) 116, frequency divider 118 and off-chip loop filter 119. Phase/frequency detector 112 has detector inputs 120 and 122 and charge pump control outputs 124 and 126. Outputs 124 and 126 are coupled to inputs 128 and 130 of charge pump 144. Charge pump 114 has an output 132 which is coupled to loop filter node 133 and input 134 of VCO 116. VCO 116 has an output 136 which is coupled to input 138 of frequency divider 118. Frequency divider 118 has an output 140 which is coupled to input 122 of phase/frequency detector 112. Loop filter 119 includes resistor R1 and capacitor C1 which are coupled together in series between loop filter node 133 and ground terminal GND.

During operation, phase/frequency detector 112 detects a phase difference between an input signal FIN applied to detector input 120 and a reference feedback signal REF applied to detector input 122. Phase/frequency detector 112 generates "up" and "down" signals on outputs 124 and 126 as a function of the phase difference. The up and down signals are applied to charge pump 114 which causes the charge pump to increase, decrease or not change the voltage on loop filter node 133. VCO 116 receives the voltage on filter node 133 and responsively increases, decreases or does not change its frequency of oscillation, and thus the frequency of oscillation of output signal $F_{OUT}$. Output signal $F_{out}$ is fed back to phase/frequency detector 112 through frequency divider 118. This process continues until PLL 100 locks the reference feedback signal REF onto the phase and frequency of input signal $F_{IN}$.

PLL 100 further includes phase lock detector 150, which includes phase error measurement circuit 10 and phase lock signal generator 152. Clock signal inputs CLK1 and CLK2 of circuit 10 are coupled to receive reference feedback signal REF and input signal $F_{IN}$, respectively, of PLL 100. In one embodiment, phase error decoder 16 (shown in FIGS. 1, 2 and 3) is configured as shown in FIG. 2 such that phase error estimate output 18 is a single flag bit having a logic state indicating whether the phase error between reference feedback signal REF and input signal $F_{IN}$ is less than the threshold level that is selected by threshold select input 28 or pre-set within circuit 10.

Phase lock signal generator 152 receives the phase error status flag on output 18 and responsively generates a LOCK signal on output 154, which indicates whether PLL 100 is in a locked state or an unlocked state. In one embodiment, phase lock signal generator 152 includes a counter that is clocked by a known frequency. Phase error estimate output 18 is used to enable the counter within phase lock signal generator 152. The counter counts the time duration in which the phase error status flag on output 18 is inactive. If the status flag on output 18 stays low for at least a predetermined time period, then PLL 100 is considered to be in the locked state, and phase lock signal generator 152 activates the LOCK signal on output 154. This signal can be used by the integrated circuit or by external test equipment for monitoring or testing clock jitter in PLL 100. The phase error measurement circuit of the present invention can also be used in other applications.

Although the present invention has been described with reference to preferred embodiments, workers skilled in the art will recognize that changes may be made in form and detail without departing from the spirit and scope of the invention. For example, the present invention can be implemented on integrated circuits having various technologies, such as MOS technology. Also, the particular PLL described herein is provided as an example only. Various other types of PLL circuits and delay-locked loop (DLL) circuits can also be used. The term "coupled" can include various types of connections or couplings and can include a direct connection or a connection through one or more intermediate components. The terms "phase lead" and "phase lag" used in the specification and claims are interchangeable.

What is claimed is:

1. A phase error measurement circuit comprising:
   a first clock signal input;
   a second clock signal input;
   a first phase detector comprising a first plurality of phase latches, each phase latch having a latch data input, which is coupled to the first clock signal input, a latch control input, which is coupled to the second clock signal input and a latch data output;
   a respective phase delay from the first clock signal input to the latch data outputs of each of the first plurality of phase latches, wherein each of the respective phase delays is different than the other of the phase delays; and
   a phase error measurement output formed by the latch data outputs.

2. The phase error measurement circuit of claim 1 wherein:
   the latch data outputs of the first plurality of phase latches have logic states, which indicate a direction and magnitude of a phase difference between the first clock signal input and the second clock signal input.

3. The phase error measurement circuit of claim 1 wherein:
   the first phase detector comprises a phase lead detector and the first plurality of phase latches comprises phase lead latches;
   the phase error measurement circuit further comprises a second, phase lag detector, which comprises:
   a plurality of phase lag latches, each phase lag latch having a latch data input, which is coupled to the second clock signal input, a latch control input, which is coupled to the first clock signal input and a latch data output; and
   a respective phase delay from the second clock signal input to the latch data outputs of each of the plurality of phase lag latches, wherein each of the respective phase delays is different than the other of the phase delays in the phase lag detector; and
   the latch data outputs of the phase lead latches and the phase lag latches together form the phase error measurement output and have a combined logic pattern that represents a direction and magnitude of a phase difference between the first clock signal input and the second clock signal input.

4. The phase error measurement circuit of claim 3 wherein:
   the plurality of phase lead latches comprises a first phase lead latch and at least one additional phase lead latch;
   the plurality of phase lag latches comprises a first phase lag latch and at least one additional phase lag latch;
   the respective phase delays for the additional phase lead latches each comprises a phase lead delay element coupled between the first clock signal input and the latch data input of the respective phase lead latch; and
   the respective phase delays for the additional phase lag latches each comprises a phase lag delay element coupled between the second clock signal input and the latch data input of the respective additional phase lag latch.

5. The phase error measurement circuit of claim 4 wherein:
   the respective phase delay for the first phase lead latch comprises a phase lead delay element coupled between the first clock signal input and the latch data input of the first phase lead latch; and
   the respective phase delay for the first phase lag latch comprises a phase lag delay element coupled between the first clock signal input and the latch data input of the first phase lag latch.

6. The phase error measurement circuit of claim 1 wherein:
   the phase delay elements have phase delays that are multiples of a base phase delay.

7. The phase error measurement circuit of claim 1 wherein each of the phase latches comprises an edge-triggered D-type flip-flop.

8. A phase error measurement circuit comprising:
   a first clock signal input;
   a second clock signal input;
   means for delaying the first clock signal input by a plurality of phase lead measuring delays to produce a plurality of delayed first clock signal inputs;
   means for delaying the second clock signal input by a plurality of phase lag measuring delays to produce a plurality of delayed second clock signal inputs;
   phase lead measurement means for detecting whether the plurality of delayed first clock signal inputs lead the second clock signal input; and
   phase lag measurement means for detecting whether the plurality of delayed second clock signal inputs lead the first clock signal input.

9. The phase error measurement circuit of claim 8 wherein:
   the phase lead measurement means comprises a plurality of phase lead latches, wherein each phase lead latch comprises a data input, which is coupled to the delayed first clock signal input, a latch control input, which is coupled to the second clock signal input, and a data output;
   the means for delaying the first clock signal input comprises a plurality of phase lead delay elements coupled in respective data paths between the first clock signal input and the data outputs of respective ones of the phase lead latches;
   the phase lag measurement means comprises a plurality of phase lag latches, wherein each phase lag latch comprises a data input, which is coupled to the delayed second clock signal input, a latch control input, which is coupled to the first clock signal input, and a data output; and
   the means for delaying the second clock signal input comprises a plurality of phase lag delay elements coupled in respective data paths between the second clock signal input and the data outputs of respective ones of the phase lag latches.

10. The phase error measurement circuit of claim 9 wherein:
    each of the phase lead delay elements has a delay that is different from the delays of the other phase lead delay elements; and
    each of the phase lag delay elements has a delay that is different from the delays of the other phase lag delay elements.

11. The phase error measurement circuit of claim 10 wherein:
the data outputs of the phase lead latches and the phase lag latches form a combined logic pattern that represents a direction and magnitude of a phase difference between the first clock signal input and the second clock signal input.

12. The phase error measurement circuit of claim 10 wherein:
the phase lead delay elements and the phase lag delay elements have phase delays that are multiples of a base phase delay.

13. A phase-locked loop comprising:
a phase detector having a clock input, a feedback input, and a charge control output;
a charge pump coupled to the charge control output;
a loop filter coupled to the charge pump;
a voltage controlled oscillator having a control voltage input coupled to the loop filter and a clock output coupled to the feedback input; and
a phase lock detector comprising:
a phase lead detector comprising a phase lead latch having a data input coupled to the feedback input, a latch control input coupled to the clock input, a data output and a phase lead delay from the feedback input to the data output, which represents a threshold phase difference between the feedback input and the clock input under which the phase-locked loop is in a lock state, wherein the data output of the phase lead latch has a first logic state when the feedback input leads the clock input by less than the phase lead delay and a second, opposite logic state when the feedback input leads the clock input by more than the phase lead delay;
a phase lag detector comprising a phase lag latch having a data input coupled to the clock input, a latch control input coupled to the feedback input, a data output and a phase lag delay from the clock input to the data output, which represents the threshold phase difference, wherein the data output of the phase lag latch has the first logic state when the feedback input lags the clock input by less than the phase lag delay and the second logic state when the feedback input lags the clock input by more than the phase lag delay; and
a phase lock signal generator, which comprises a counter circuit, which is coupled to the data outputs of the phase lead and phase lag latches for counting a duration in which either of the data outputs is in the first logic state and responsively generates a phase lock signal indicative of whether the phase-locked loop is in the lock state.

14. The phase-locked loop of claim 13, wherein:
the phase lead detector comprises a plurality of phase lead latches, wherein each phase lead latch comprises a data input, which is coupled to the feedback input, a latch control input, which is coupled to the clock input, a data output coupled to the phase lock signal generator, and a phase lead delay from the feedback input to the data output of that latch, and wherein the phase lead delay of each phase lead latch is different than the phase lead delays of the other phase lead latches; and
the phase lag detector comprises a plurality of phase lag latches, wherein each phase lag latch comprises a data input, which is coupled to the clock input, a latch control input, which is coupled to the feedback input, a data output coupled to the lock signal generator, and a phase lag delay from the clock input to the data output of that latch, and wherein the phase lag delay of each phase lag latch is different than the phase lag delays of the other phase lag latches.

15. The phase-locked loop of claim 14 wherein the threshold phase difference is selectable by the phase lock signal generator.

16. The phase-locked loop of claim 15 wherein the phase lock signal generator comprises a threshold select input, which selects the data output of one of the phase lead latches and the data output of one of the phase lag latches and generates the phase lock signal based on the selected data outputs.

17. A method of measuring phase error between first and second clock signals on an integrated circuit, the method comprising:
delaying the first clock signal by a plurality of different phase lead delays to produce a plurality of delayed first clock signals;
latching the delayed first clock signals as a function of the second clock signal to produce a phase lead indicating output signal;
delaying the second clock signal by a plurality of different phase lag delays to produce a plurality of delayed second clock signals;
latching the delayed second clock signals as a function of the first clock signal to produce a phase lag indicating output signal; and
generating signal indicative of the phase error between the first and second clock signals relative to the phase lead delays and the phase lag delays based on the phase lead indicating output and the phase lag indicating output.

18. The method of claim 17 and further comprising:
latching the plurality of delayed first clock signals with a plurality of edge-triggered phase lead latches as a function of the second clock signal to produce a plurality of phase lead indicating output signals; and
latching the plurality of delayed second clock signals with a plurality of edge-triggered phase lag latches as a function of the first clock signal to produce a plurality of phase lag indicating output signals.

19. The method of claim 18 wherein the step of generating signal indicative of the phase error comprises measuring a magnitude and direction of the phase error as a function of the plurality of phase lead and phase lag indicating output signals and the phase lead and phase lag delays.

* * * * *